(12) United States Patent
Yanase et al.

(10) Patent No.: US 7,855,152 B2
(45) Date of Patent: Dec. 21, 2010

(54) METHOD OF PRODUCING ACTIVE MATRIX SUBSTRATE

(75) Inventors: Kiyoshi Yanase, Kawasaki (JP); Satoshi Doi, Kawasaki (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 146 days.

(21) Appl. No.: 11/782,929

(22) Filed: Jul. 25, 2007

(65) Prior Publication Data

US 2008/0026573 A1    Jan. 31, 2008

(30) Foreign Application Priority Data

Jul. 25, 2006 (JP) .............................. 2006-202263
Jun. 11, 2007 (JP) .............................. 2007-154003

(51) Int. Cl.
*H01L 21/302* (2006.01)
(52) U.S. Cl. ..................... 438/745; 438/737; 438/706; 257/E21.215
(58) Field of Classification Search ................. 438/706, 438/712, 737, 745; 257/E21.215
See application file for complete search history.

(56) References Cited

U.S. PATENT DOCUMENTS 5,882,996 A * 3/1999 Dai .............................. 438/597

6,271,084 B1 * 8/2001 Tu et al. ..................... 438/253
2002/0140895 A1 * 10/2002 Kimura et al. ............. 349/187
2002/0142610 A1 * 10/2002 Chien et al. ................. 438/710

FOREIGN PATENT DOCUMENTS

| JP | 7-37866 A | 2/1995 |
|---|---|---|
| JP | 2001-102362 A | 4/2001 |
| JP | 2001-308182 A | 11/2001 |
| WO | WO 00/39845 A1 | 7/2000 |

OTHER PUBLICATIONS

"Dictionary of Physics" 2004, Macmillan Publishers, p. 819.*

* cited by examiner

*Primary Examiner*—Bradley K Smith
(74) *Attorney, Agent, or Firm*—Sughrue Mion, PLLC (57) ABSTRACT

The invention provides a production method for an active matrix substrate in which a plurality of contact holes are formed by a one-mask process so as to reach metal films which are present at different depth positions in an insulating layer and are not evaporated by dry etching using a fluorine-containing gas. The method includes a step of performing dry etching using mixed gas of $CHF_3$, $CF_4$ and $O_2$ to form the plurality of contact hole, a step of subjecting the plurality of contact holes to oxygen ashing, and a step of forming a transparent conductive film in the plurality of contact holes.

6 Claims, 6 Drawing Sheets

FIG. 1

RELATED ART

METHOD OF PRODUCING ACTIVE MATRIX SUBSTRATE

The present application claims the benefit of priority of Japanese Patent Application No. 2006-202263 filed Jul. 25, 2006, and Japanese Patent Application No. 2007-154003 filed Jun. 11, 2007, the disclosures of which are incorporated herein by reference in their entirety.

BACKGROUND OF THE INVENTION

1. Field of the Invention

The present invention relates to a production method for an active matrix substrate, in which a contact hole is formed in an insulating layer to provide electrical connection, in a semiconductor device or a liquid crystal display, between an electrode, wiring, or terminal (hereafter, referred to simply as the "electrode") and an upper electrode arranged thereabove with the insulating layer interposed therebetween. The present invention particularly relates to a production method for an active matrix substrate suitable for use when the electrode is composed of a Cr film or Cr alloy film (hereafter, referred to simply as the "Cr film"), or an Al film or Al alloy film (hereafter, referred to simply as the "Al film").

2. Description of the Related Art

In general, dry etching of RIE (Reactive Ion Etching) type using fluorine gas such as $CF_4$ or $SF_6$ alone is performed when a plurality of contact holes are formed in a silicon insulating layer by a one-mask process to reach a plurality of electrodes formed of a Cr or Al film and located at different depth positions in the silicon insulating layer. This type of contact hole forming method is disclosed in Japanese Laid-Open Patent Publication No. 2001-102362 (Patent Document 1) and No. 2001-308182 (Patent Document 2), for example.

Figure 1:
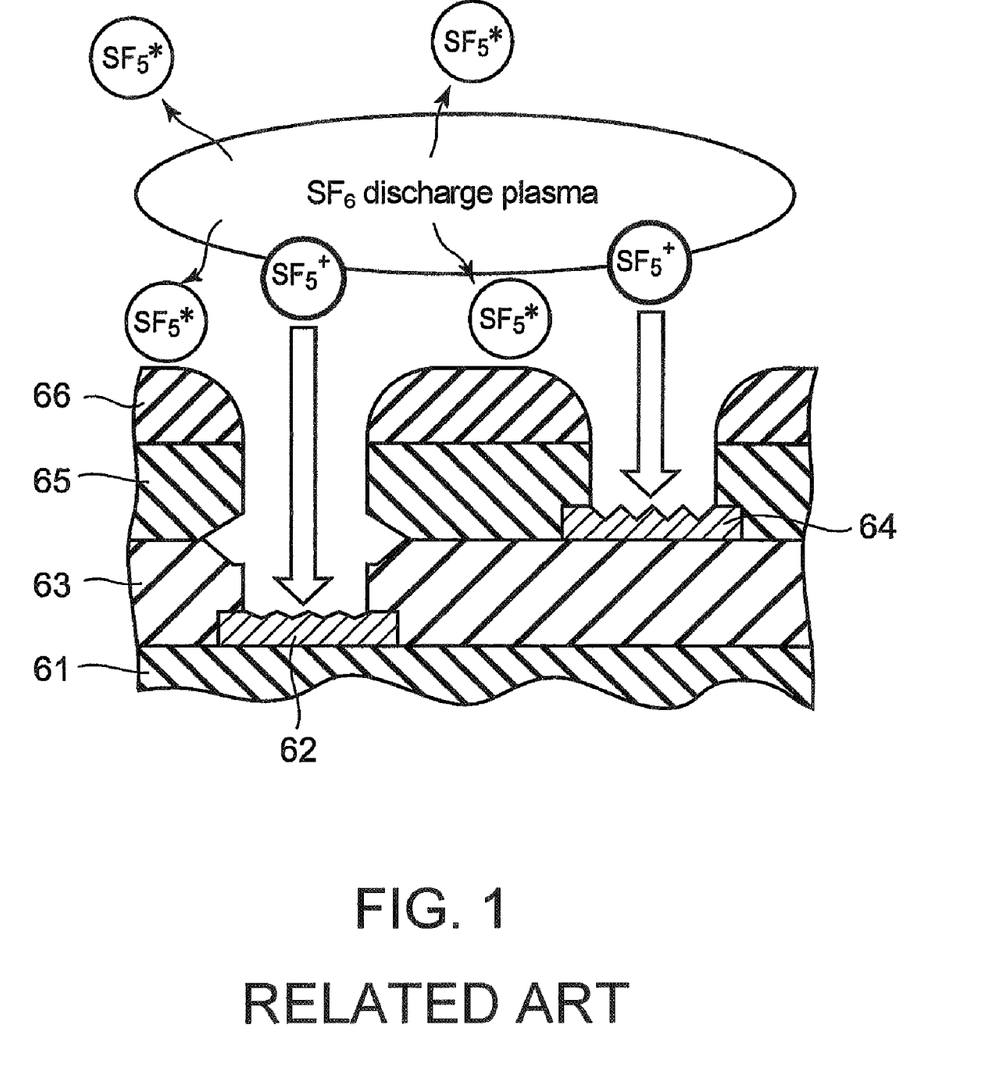
FIG. 1 is a diagram for explaining a method of forming contact holes in an active matrix substrate according to a related art as a comparative example.

FIG. 1 is a diagram showing a contact hole forming method according to a related art similar to those disclosed in Patent Documents 1 and 2.

Referring to FIG. 1, a first electrode 62 formed of a Cr film and a second electrode 64 also formed of a Cr film are located at different depth positions on and above a glass substrate 61. A silicon insulating layer 63 and another silicon insulating layer 65 are arranged on the first electrode 62. The silicon insulating layer 65 is located on the second electrode 64. RIE dry etching using $SF_6$ gas alone is performed to form contact holes in the silicon insulating layers 63 and 65 so as to reach the first electrode 62 and the second electrode 64, respectively, through a resist layer 66.

In contrast, when a contact hole is formed in a silicon insulating layer to reach an electrode formed of an Al film or the like and located within a silicon insulating layer, RIE dry etching using mixed gas of $CHF_3$ and $CF_4$ is performed. This type of contact hole forming method is, for example, disclosed in Japanese Laid-Open Patent Publication No. H07-37866 (Patent Document 3) and WO 00/039845(Patent Document 4).

SUMMARY OF THE INVENTION

When the RIE dry etching using fluorine gas such as $CF_4$ or $SF_6$ alone is performed according to Patent Document 1 or Patent Document 2, contact resistance is increased between the electrode formed of a Cr film or Al film and a transparent conductive film formed in the contact hole. When a plurality of contact holes with different depths are formed, in particular, the electrode in a shallower contact hole is more susceptible to ion damage and the contact resistance becomes extremely higher than a design value.

In order to decrease the contact resistance between the transparent conductive film and the Cr film or Al film, it is effective to increase the gas pressure during dry etching to thereby decrease the self-bias voltage. However, if the gas pressure is increased up to about 30 Pa or higher during the RIE dry etching using $SF_6$ gas alone, isotropic etching by $SF_5$ radicals occurs at an interface between a silicon insulating layer (gate insulating layer) on an electrode located at a deep position and a silicon insulating layer (protective film) on an electrode located at a shallow position. As a consequence, the interface portion is over-etched in a wedge shape manner. This problem also occurs when $CF_4$ gas is used alone. Accordingly, it is difficult for the RIE dry etching using fluorine gas such as $CF_4$ or $SF_6$ alone to provide optimum conditions for realizing both suitable control of the contact resistance and formation of contact holes having desirable shapes.

The contact resistance between the Cr film or Al film and the transparent conductive film depends on the surface condition of the Cr or Al film. It is presumed that the surface condition of the Cr or Al film is determined depending on any damages that the Cr or Al film suffers due to ions applied to the film surface during etching, namely, atomic mixing or roughened surface due to ion implantation, and on the protective effect against such damages that is conferred by deposition on the Cr or Al film surface due to secondary reaction of the etching.

When $SF_6$ gas is used alone, heavy ions are generated in plasma since the mass number of silicon is great while the bonding number of fluorine is also great. In order to remove a Cr silicide layer or Al silicide layer that is present on the surface of the Cr or Al film after removal of the silicon insulating layer, a minimum of ionic etching is required. Since the $SF_6$ ions are heavy, the Cr silicide is removed in a short period of time. Further, unlike carbonaceous gas, chemical species generated by $SF_6$ gas do not cause deposition to cover the surface of the Cr or Al film. Thus, the Cr or Al film surface is fluorinated. As a result, the contact resistance is increased.

When $CF_4$ gas alone is used as the primary component, it is difficult to selectively generate $CF^{3+}$ important for a silicon-type etchant, while by-products (such as $C^+$, $CF^+$, and $CF^{2+}$) contributing to carbonaceous polymerization reaction, and highly reactive fluorine radicals are generated in great quantities. As a result, the influence of deposition reaction or fluorine reaction on the Cr film surface becomes too strong so that the etching rate is varied in etching apertures or the contact resistance is increased.

If the dry etching pressure is increased so as to decrease the contact resistance, the probability that ions collide with molecules is increased. Accordingly, the effect of anisotropic etching on the Cr or Al film surface that constitutes an advantage of the RIE dry etching becomes weak, while contribution of the radical species to isotropic etching becomes prominent. Consequently, abnormal etching tends to occur in the interface between the two silicon insulating layers. As a consequence, the control of the etching shape of the contact holes becomes difficult. If such abnormal etching progresses, the transparent conductive film formed in the contact holes is disconnected so as to cause formation of point defects in a liquid crystal display using the active matrix substrate.

According to the RIE dry etching methods using fluorine gas such as $CF_4$ or $SF_6$ alone disclosed in Patent Documents 1 and 2, as described above, it is required to add various process processing steps for the purpose of reducing the contact resistance.

It is therefore an exemplary object of the present invention to provide a production method for an active matrix substrate, which uses a simple process and yet is capable of reducing the contact resistance between an electrode formed of a Cr film or Al film and a transparent conductive film formed in a contact hole.

An exemplary aspect of the present invention relates to a production method for an active matrix substrate in which a plurality of contact holes are formed by a one-mask process so as to reach metal films which are present at different depth positions in an insulating layer and are not etched by dry etching using a fluorine-containing gas, and the method includes the steps of performing dry etching using mixed gas of $CHF_3$, $CF_4$ and $O_2$ to form the plurality of contact holes; subjecting the plurality of contact holes to oxygen ashing; and forming a transparent conductive film in the plurality of contact holes.

DESCRIPTION OF THE EXEMPLARY EMBODIMENTS

First Exemplary Embodiment

A first exemplary embodiment of the present invention will be described in detail with reference to the drawings.

A production method for active matrix substrates according to the first exemplary embodiment of the present invention is a method in which a plurality of contact holes are formed by a one-mask process so as to reach a plurality of electrodes which are located at different depth positions within a silicon insulating layer and formed of a Cr film or an Al—Ni alloy film for example that is directly contactable with a transparent conductive film.

Figure 2:
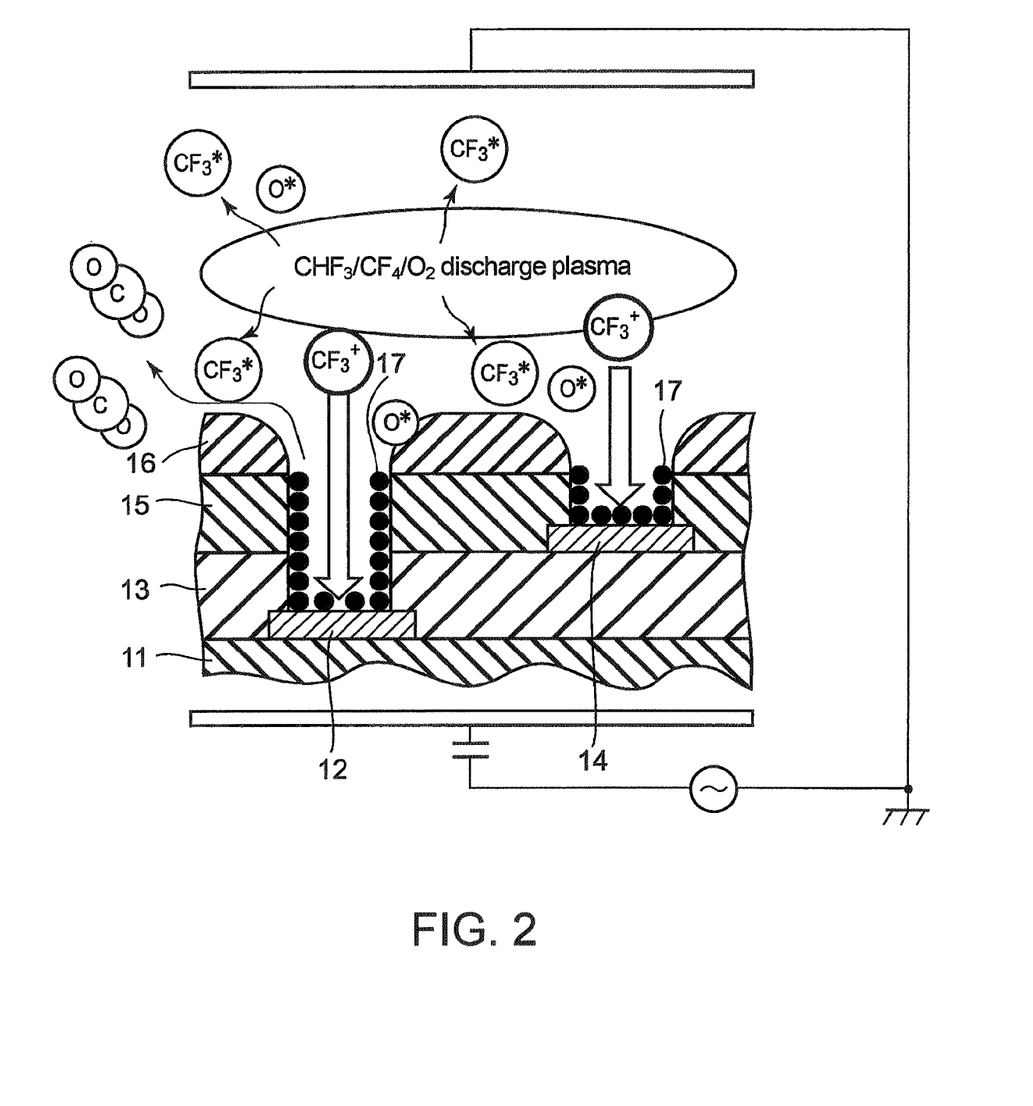
FIG. 2 is a diagram for explaining a dry etching process in a method of forming contact holes in an active matrix substrate according to the present invention.

Referring to FIG. 2, there are located, at different depth positions on and above a glass substrate 11, a first electrode 12 formed of a Cr film or an Al film (Al—Ni alloy film), and a second electrode 14 formed of a Cr film or an Al film (Al—Ni alloy film). A silicon insulating layer 13 and a silicon insulating layer 15 are arranged on the first electrode 12. The silicon insulating layer 15 is arranged on the second electrode 14.

Figure 3:
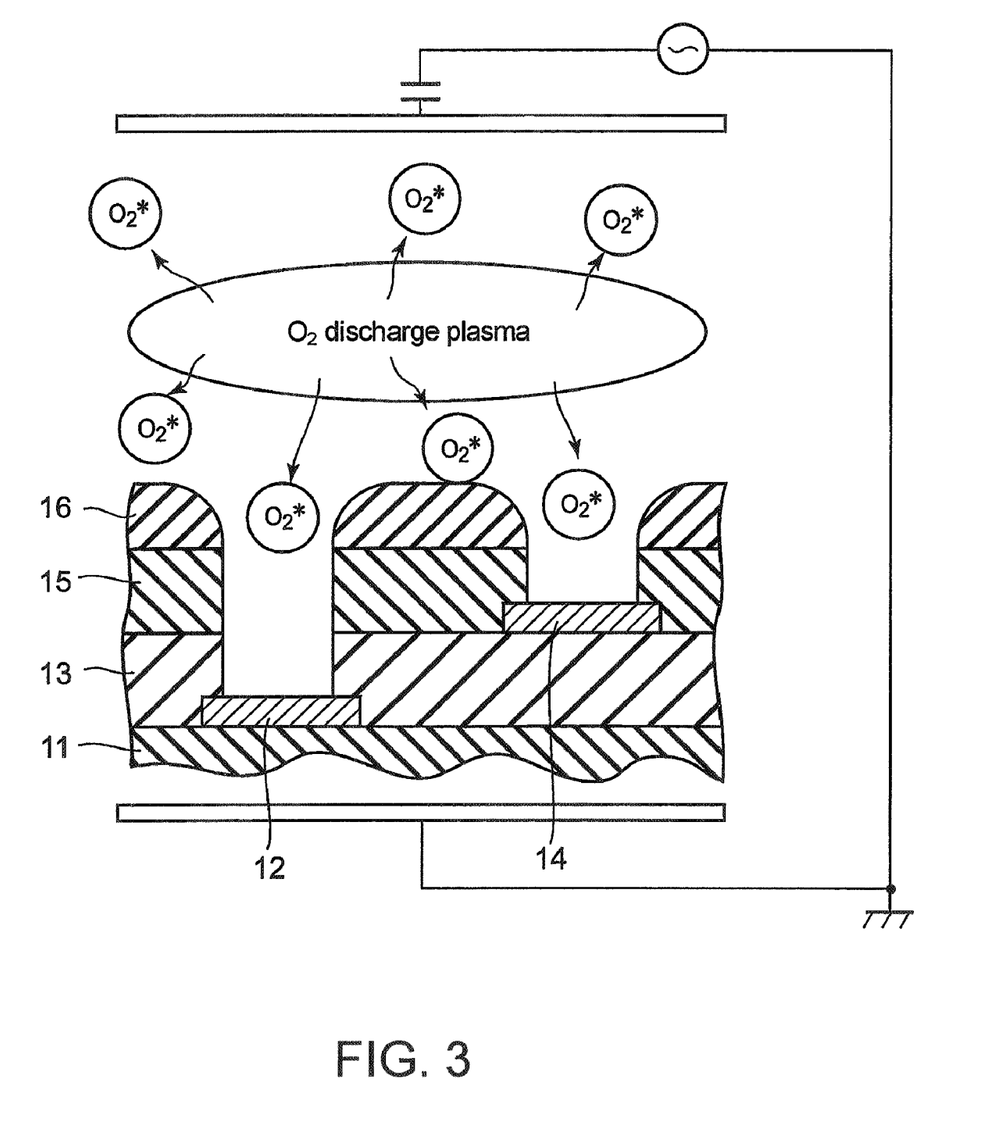
FIG. 3 is a diagram for explaining an ashing process in a method of forming contact holes in an active matrix substrate according to the present invention.

This method particularly includes a step shown in FIG. 2 of performing dry etching using mixed gas of $CHF_3$, $CF_4$ and $O_2$ ($CHF_3/CF_4/O_2$ gas) to form two contact holes in the silicon insulating layer so as to reach the first electrode 12 and the second electrode 14, respectively, through a resist layer 16, and a step shown in FIG. 3 of performing oxygen ashing to remove a carbonaceous polymer deposit 17 from the surfaces of the resist layer 16 and the Cr film or Al film (Al—Ni alloy film).

Herein, the oxygen ashing is carried out as shown in FIG. 3 by using $O_2$ radicals in $O_2$ discharge plasma.

The dry etching used herein is a RIE dry etching method, for example. The oxygen ashing is a plasma etching (PE) method.

This method is able to reduce the contact resistance between the respective electrodes 12 and 14 located at different depths and formed of a Cr film or an Al film (Al—Ni alloy film) and a transparent conductive film (not shown) formed in the contact holes formed to reach the electrodes 12 and 14. In addition, the contact holes are formed in a desirable forward tapered shape. Detailed description will be made of this point.

The contact resistance between the Cr film or Al film (Al—Ni alloy film) forming the electrodes 12 and 14 and the transparent conductive film formed in the contact hole reaching the Cr film or Al film (Al—Ni alloy film) depends on the surface condition of the Cr film or Al film. It is estimated that the contact resistance is influenced by ion damage occurring on the surface of the Cr or Al film during the etching, such as atomic mixing due to ion implantation or roughened surface, and also by the protective effect against such damages that is provided by deposition on the Cr or Al film surface due to secondary reaction of the etching.

In this embodiment, the ion damage is suppressed by using $CHF_3$ gas easy to selectively generate $CF^{3+}$ important for the etching reaction, together with mixed gas of $CF_4$ and $O_2$ important for the deposition reaction. A carbonaceous polymer deposit 17 is formed during the dry etching of the present invention. This carbonaceous polymer deposit 17 provides a function to protect the Cr or Al film, and can be easily removed by $O_2$ ashing when the protective function is not required any more (see FIG. 3).

$CF_4$ is a deposition-gas material. As shown in FIG. 2, $O_2$ acts to remove the carbonaceous polymer deposit 17 to some extent in the form of $CO_2$ and to inhibit the excessive deposition.

If no $O_2$ is contained in the etching gas, the deposition reaction becomes so strong that the etching is hindered, or a carbonaceous deposit difficult to remove is formed on the Cr or Al film surface. Therefore, $O_2$ is crucial for controlling the deposition reaction.

The $CHF_3/CF_4/O_2$ gas used in the dry etching method according to this embodiment is primarily composed of one carbon atom and the fluorine bonding number is also small (one to three). Therefore, the mass of ions generated in the plasma is smaller than that of ions derived from $SF_6$ in the prior arts. Accordingly, the ion damage can be reduced.

Further, the carbonaceous gas causes a phenomenon, as a secondary reaction, to deposit a carbonaceous polymer from CFx on the surface of the Cr for Al film. Therefore, the surface of the Cr film or Al film is protected by the carbonaceous polymer deposit 17 during the etching process.

As a result, a longer etching time is required to remove the affected layer on the surface of the Cr or Al film than in the conventional method using $SF_6$ gas. On the other hand, the etching time of the silicon insulating layers 13 and 15 is substantially fixed regardless whether any deposit is present or not. This means that even if the etching process is performed for enough time to form a deep contact hole, the ion damage to the electrode exposed in a shallow contact hole can be reduced. In this manner, the ion damage in the shallow contact hole can be minimized.

In contrast, when $SF_6$ etching gas is used for Cr or Al electrodes according to the related art, ions are heavy and no carbonaceous deposition occurs. Therefore, the affected layer on the surface of the Cr or Al film is removed in a short period of time after the end point of etching. Consequently, the etching conditions have to be optimized to complete the etching substantially at the end point of etching.

Further, according to the present embodiment, the carbonaceous polymer is also deposited on the side walls of the contact hole so that the progress of isotropic etching is suppressed. As a consequence, the contact hole is formed into a desirable forward tapered shape.

If the quantity of $CF_4$ is great than $CHF_3$ in the $CHF_3/CF_4/O_2$ gas, the same problem is apt to occur as the case when $CF_4$ gas alone is used.

Therefore, the proportion between $CHF_3$ and $CF_4$ in the $CHF_3/CF_4/O_2$ gas is preferably set such that $CHF_3 > CF_4$.

The over-etching time on the electrode surface preferably falls within a range of about 60 to 300 seconds in consideration of the removability of the affected layer on the Cr or Al film surface and the influence of the carbonaceous polymer deposit 17.

Additionally, wet etching may be performed to a certain degree prior to the dry etching when the contact hole to be formed is deep or for the purpose of improving the production capacity.

However, there is a highly resistive affected layer on the surface of the Cr or Al film that has been covered with the silicon insulating layer 13, 15. This affected layer cannot be removed easily by the wet etching process. Therefore, the Cr or Al film surface must be always treated by the dry etching process. The use of the RIE dry etching method which is an ionic etching process is particularly effective in removal of the affected layer. Moreover, since the wet etching progresses isotropically, the shape of the contact hole cannot be controlled with the wet etching process only. Further, since the resist resistance is not high enough for the wet etching performed for a long period of time, it is indispensable for the wet etching to be used in combination with the RIE dry etching method.

When the dry etching and wet etching processes are used in combination, there occurs a problem of variation of the etching rate since the wet etching deteriorates the etching solution due to elusion of silicon into the etching solution or evaporation of the etching solution. As a result, the thickness of the residual silicon insulating layer during the dry etching varies. In order to avoid this, it is considered to detect an etching end point by monitoring plasma emission or electrode voltage during the dry etching process to detect a change in plasma composition before and after the exposure of the Cr or Al film surface. However, in the case of dry etching for forming a contact hole with a low aperture ratio, the change in the monitored value before and after completion of the etching is too small to accurately detect the etching end point. Therefore, the problem of variation of the etching rate should be solved by appropriate time settings, taking enough over-etching time into account.

According to this embodiment using $CHF_3/CF_4/O_2$ gas, as described above, the contact resistance between the Cr or Al film and the transparent conductive film is hardly affected by the etching time. Therefore, it is possible to set the over-etching time sufficiently long in consideration of the variation in thickness of the insulating layer and deterioration of the etching solution. Accordingly, this embodiment provides an advantage that the contact resistance can be controlled stably at a low level.

The carbonaceous polymer deposit 17 formed in the contact hole causes increase of the contact resistance if it is left there, but can be removed by $O_2$ ashing performed after the etching process (see FIG. 3). The $O_2$ ashing according to the present embodiment is preferably performed for a longer period of time than a conventional $O_2$ ashing method, because the carbonaceous polymer deposit 17 formed on the surface of the Cr or Al film during the etching has to be removed. Specifically, the $O_2$ ashing time preferably falls within a range of about 120 to 240 seconds.

The contact resistance is significantly influenced by a time for which the Cr or Al film surface is subjected to etching and a designated oxygen ashing time. If the dry etching time is too long, the carbonaceous deposition progresses so much that it takes a longer time for the subsequent oxygen ashing step. The time for these steps should be as short as possible in view of the capacity of the production equipment.

The $O_2$ ashing process exhibits its optimal effect in a certain region. While the carbonaceous polymer deposit 17 is removed in an initial state of the $O_2$ ashing process, oxidation of the Cr or Al film surface progresses if it is continued for a long period of time. The optimal $O_2$ ashing time is defined as the time required to remove, by means of $O_2$ plasma, the carbonaceous polymer deposit 17 formed on the Cr or Al film surface by the etching process using $CHF_3/CF_4/O_2$ gas. The contact resistance between the Cr or Al film and the transparent conductive film is increased if the $O_2$ ashing time is either longer or shorter than the optimal time. If it is longer, the carbonaceous polymer deposit 17 cannot be removed sufficiently. If it is shorter, the oxidation of the Cr or Al film surface affects the contact resistance. However, the optimal $O_2$ ashing time can be controlled stably enough, for example, by adopting the PE method which is able to suppress the impact of the oxygen ions to the Cr or Al film. In this manner, the time range as mentioned above constitutes one of the conditions for ensuring both high production capacity and stable operation.

According to this embodiment, a fixed contact resistance can be obtained regardless of variation in self-bias voltage in the RIE dry etching apparatus.

Generally, the self-bias voltage is a parameter influencing the ion acceleration energy, thus influencing the ion damage to the electrode surface. The ion damage of the electrode surface influences the contact resistance.

Figure 6:
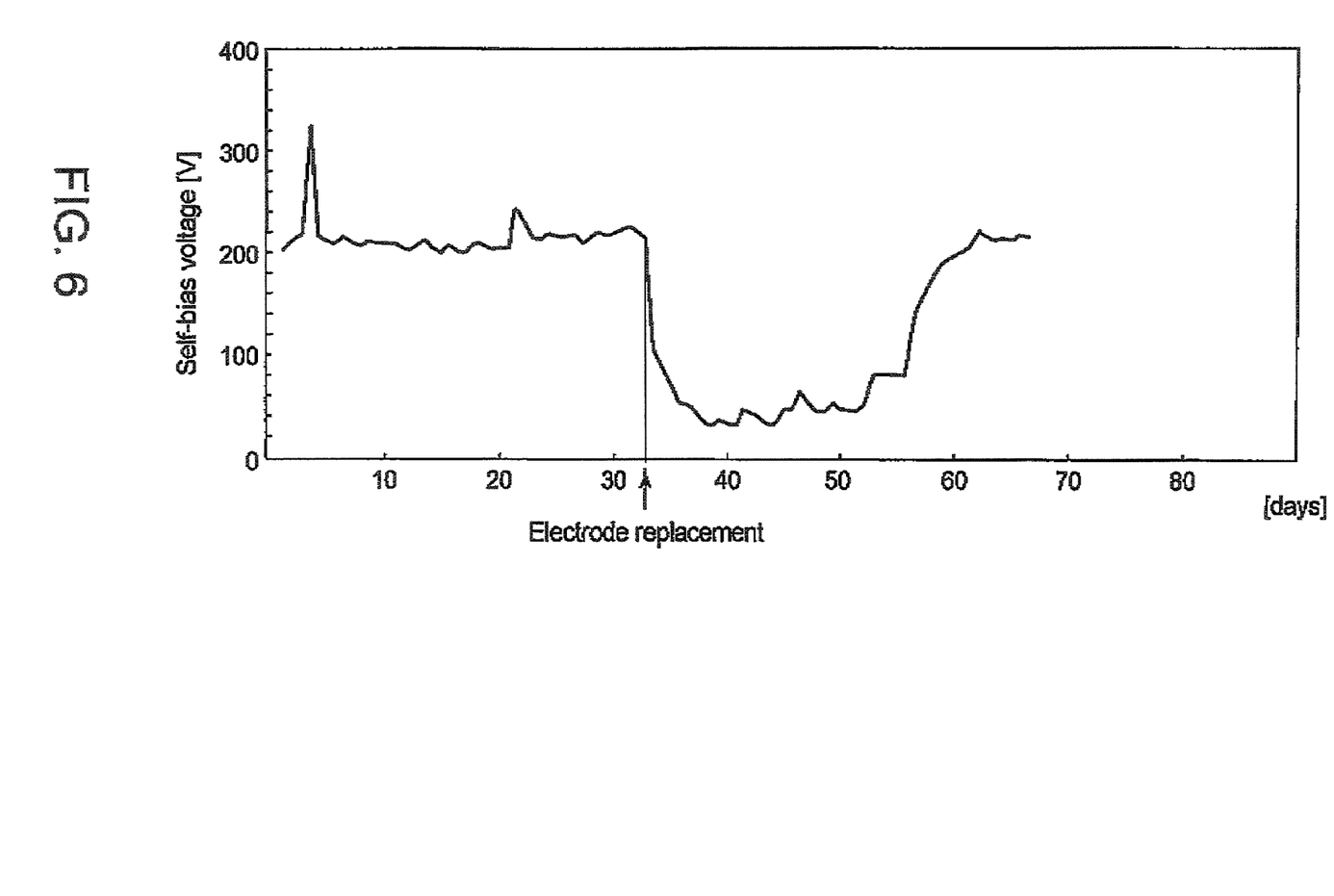
FIG. 6 is a diagram showing variation with time of self-bias voltage in a RIE dry etching apparatus.

FIG. 6 shows variation with time of self-bias voltage in a RIE dry etching apparatus which is operated in a normal manner. As shown in FIG. 6, the self-bias voltage is changed significantly by replacement of an electrode member, and then varies relatively significantly after a span of about one month. Also, the self-bias voltage varies constantly regardless of replacement of the electrode member. The self-bias voltage is generated due to a difference in effective area between the anode electrode and the cathode electrode during formation of high-frequency discharge plasma. Therefore, the self-bias voltage varies when the electrode effective area is changed. The change of the electrode effective area may occur when a component evaporated from the resist is deposited on the surface of a member formed of Al or the like of the anode and cathode electrodes, or when an alumite film or the like provided for preventing corrosion of the electrode member is worn out.

The conventional RIE dry etching method using $SF_6$ etching gas is apt to cause ion damage to the electrode surface. Therefore, the variation of the self-bias voltage as shown in FIG. 6 causes the ion damage to vary. Consequently, the contact resistance is changed also.

By contrast, according to the present embodiment using $CHF_3/CF_4/O_2$ gas, in which the ion damage hardly occurs, the contact resistance can be controlled stably even if the self-bias voltage varies as shown in FIG. 6.

A production method for an active matrix substrate according to the first exemplary embodiment of the present invention will be described specifically with reference to the drawings.

This embodiment is a preferred example of a production method for an active matrix substrate according to the present invention.

The production method for an active matrix substrate will be described with reference to FIGS. 4A to 4G.

Figure 4A:
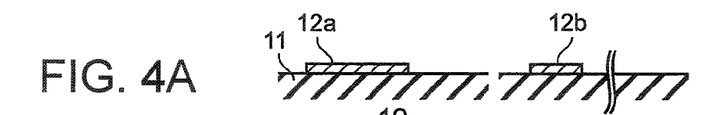
FIGS. 4A to 4G are diagrams for explaining a method of forming contact holes according to an exemplary embodiment of the present invention.

In the first step, a Cr film or an Al film (Al—Ni alloy film) is formed on a glass substrate 11 (of about 360 mm by 470 mm) by a sputtering method in a RIE dry etching apparatus. The Cr film or Al film (Al—Ni alloy film) is patterned to form a gate electrode 12a, a gate wiring (not shown), and a gate terminal electrode 12b, as shown in FIG. 4A.

Figure 4B:
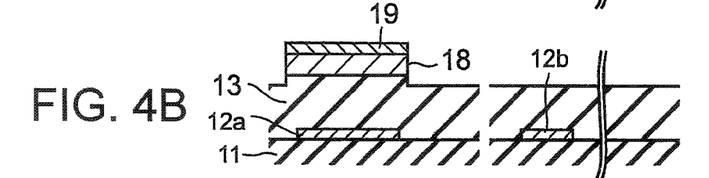

Subsequently, as shown in FIG. 4B, a silicon insulating layer 13 as gate insulating layer, an intrinsic semiconductor (a-Si:H) layer 18, and an ohmic (n+-Si:H) layer 19 are sequentially formed by a plasma CVD method. These layers are patterned to form a semiconductor (n+a-Si:H/a-Si:H) layer.

Figure 4C:
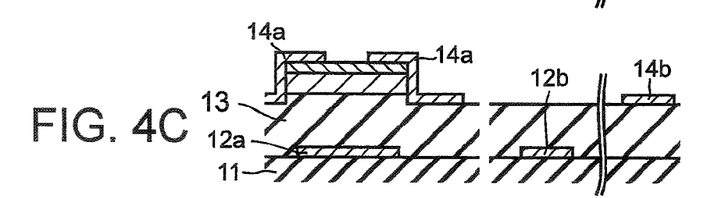

Subsequently, a Cr film or Al film (Al—Ni alloy film) is formed by a sputtering method. The Cr film or Al film (Al—Ni alloy film) is patterned to form a source-drain electrode 14a, a drain wiring (not shown), and a drain terminal electrode 14b, as shown in FIG. 4C.

Figure 4D:
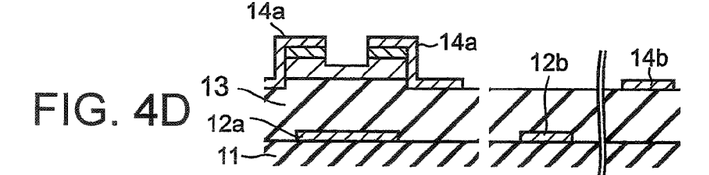

The ohmic layer 19 is then etched away to form a channel, as shown in FIG. 4D.

Figure 4E:
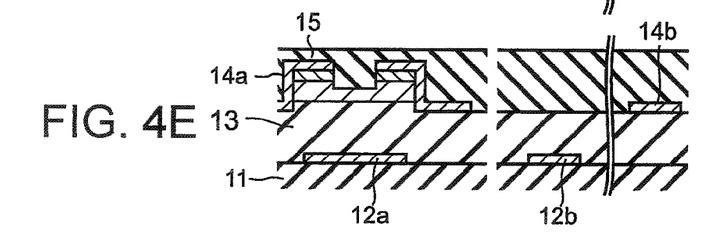

Then, a silicon insulating layer 15 is formed by a plasma CVD method as a protective layer for protecting the channel surface, as shown in FIG. 4E.

Figure 4F:
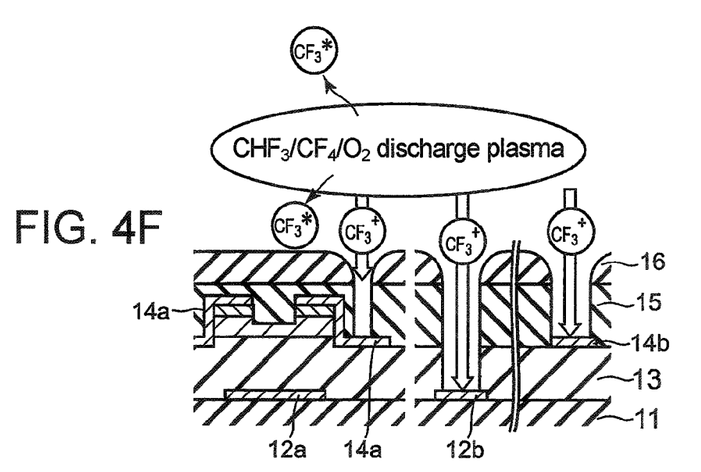

Subsequently, a resist layer 16 having a predetermined pattern as shown in FIG. 4F is formed on the silicon insulating layer 15.

Subsequently, as shown in FIG. 4F, a plurality of contact holes are formed to reach the gate terminal electrode 12b, the source-drain electrode 14a, and the drain terminal electrode 14b, respectively. The silicon insulating layer present on the gate terminal electrode 12b has the thickness (i) that is different from the thickness (ii) of the silicon insulating layer present on the source-drain electrode 14a and the drain terminal electrode 14b as described below.

(i) (Thickness of the silicon insulating layer on the gate terminal electrode 12b)=(Remaining thickness of the silicon insulating layer 13)+(Original thickness of the silicon insulating layer 15 as formed)

(ii) (Thickness of the silicon insulating layer on the source-drain electrode 14a and the drain terminal electrode 14b)=(Original thickness of the silicon insulating layer 15 as formed)

The term "remaining thickness of the silicon insulating layer 13" as used herein means that the original thickness of the silicon insulating layer 13 as formed does not remain fully since part of the silicon insulating layer 13 is etched away during the etching of the semiconductor (n+a-Si:H/a-Si:H) layer. In a manufacturing process of a hydrogenated amorphous silicon TFT, the amount of the silicon insulating layer etched away when the semiconductor (n+a-Si:H/a-Si:H) layer is removed is generally several tens nanometers.

As shown in FIG. 4F, contact holes are formed, by the RIE dry etching using $CHF_3/CF_4/O_2$ gas, in the silicon insulating layer 13 and silicon insulating layer 15 so as to reach the gate terminal electrode 12b, the source-drain electrode 14a, and the drain terminal electrode 14b, respectively. The RIE dry etching is performed under the conditions in which the flow rate of the $CHF_3/CF_4/O_2$ gas is set to 120/40/40 sccm, the pressure to 10 Pa, and the discharged energy to 1500 W. The surface of the gate terminal electrode 12b is exposed to plasma for about 60 seconds. The surfaces of the source-drain electrode 14a and the drain terminal electrode 14b are exposed to plasma for about 200 seconds.

A wet etching process is also used prior to the dry etching in the formation step of the contact holes.

Successively, the resist layer 16 is removed by $O_2$ ashing (see FIG. 3), and the substrate 11 is taken out of the RIE dry etching apparatus. For example, the $O_2$ ashing process is performed under a pressure of 133 Pa for 200 seconds.

Subsequently, a transparent conductive film of ITO (Indium Tin Oxide), IZO (Indium Zinc Oxide) or the like is formed by a sputtering method. The transparent conductive film is then patterned, as shown in FIG. 4G, to form a transparent conductive film 24a serving as a pixel electrode connected to the source electrode of the source-drain electrode 14a, a transparent conductive film 22b serving as a connection electrode connected to the gate terminal electrode 12b, and a transparent conductive film 24b serving as a connection electrode connected to the drain terminal electrode 14b.

Finally, annealing is performed to complete fabrication of a hydrogenated amorphous silicon TFT for driving liquid crystal.

Figure 4G:
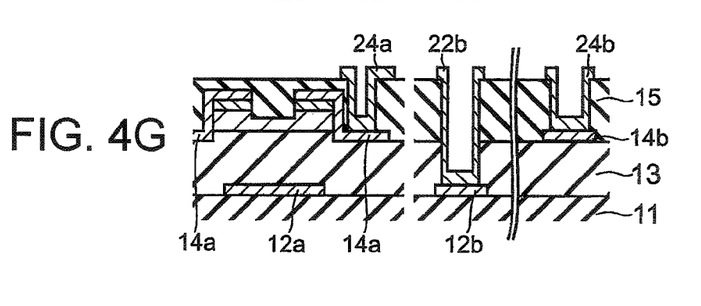
Figure 5:
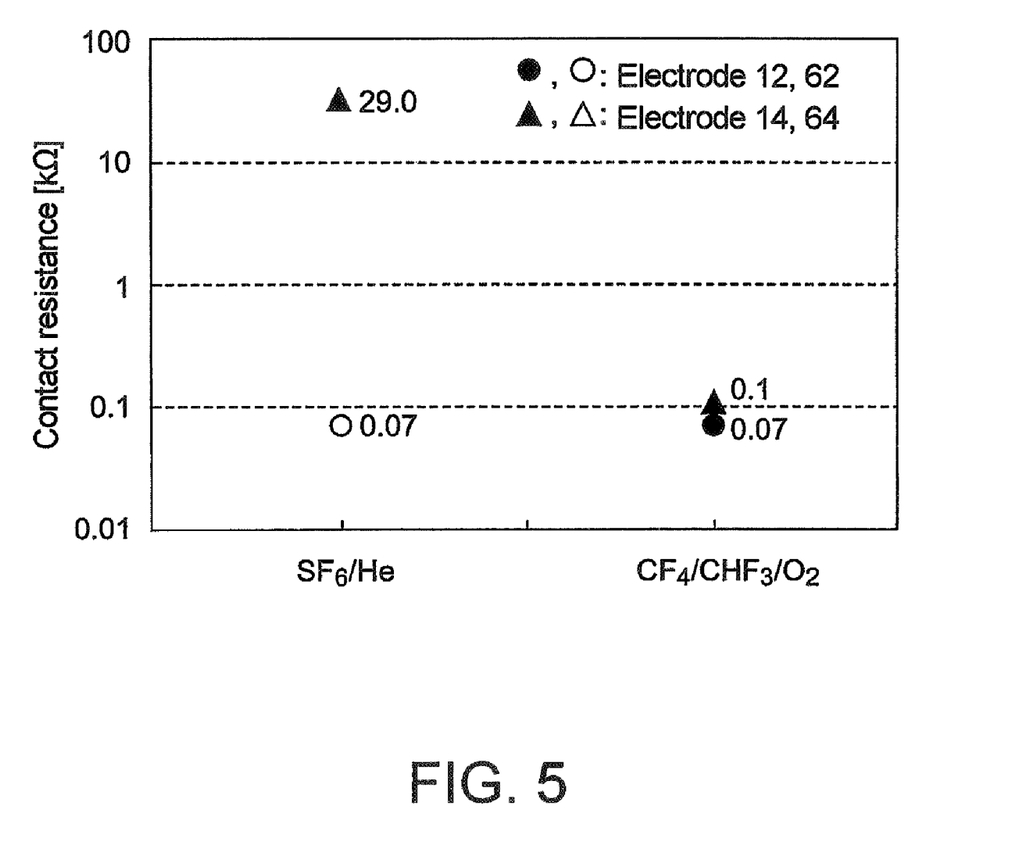
FIG. 5 is a diagram showing results of measurement of contact resistance obtained by the present invention and that obtained by the comparative example.

FIG. 5 shows contact resistance in a hydrogenated amorphous silicon TFT having a structure shown in FIG. 4G fabricated by applying the contact hole forming method of the present embodiment in which the RIE dry etching process is performed using $CHF_3/CF_4/O_2$ gas. The contact resistance values herein are values obtained by connecting 180 contact holes with a size of 10 μm by 10 μm.

FIG. 5 also shows, as a comparative example, contact resistance in a hydrogenated amorphous silicon TFT fabricated by applying the related contact hole forming method a shown in FIG. 1 in which the RIE dry etching process is performed using $SF_6$/He gas.

The comparative example is based on the conditions as follows. The substrate size is about 360 mm by 470 mm. The RIE dry etching is performed under the conditions where, for example, the flow rate of $SF_6$/He gas is 50/250 sccm, the pressure is 30 Pa, and the discharged energy is 1200 W. The surface of the electrode 62 is exposed to plasma for about 60 seconds. The surface of the electrode 64 is exposed to plasma for about 200 seconds. The time for which the surfaces of the electrodes are exposed to plasma preferably falls within a range from 60 to 300 seconds. The PE $O_2$ ashing process is performed under the pressure of 133 Pa for 200 seconds. The $O_2$ ashing time preferably falls within a range from 120 to 240 seconds. The contact resistance values of the comparative example are also obtained by connecting 180 contact holes with a size of 10 μm by 10 μm.

As seen from FIG. 5, as for the gate terminal electrode 12b (see FIG. 4G) or the electrode 62 (see FIG. 1) which is exposed to plasma for a relatively short time during the RIE dry etching process, the contact resistance thereof in the present embodiment using $CHF_3/CF_4/O_2$ gas exhibits an equivalent value to that in the comparative example using $SF_6$/He gas. On the other hand, as for the source-drain electrode 14a, the drain terminal electrode 14b (see FIG. 4G) or the electrode 64 (see FIG. 1) which is exposed to plasma for a relatively long time, the contact resistance thereof in the present embodiment is substantially lower than that in the comparative example.

According to this embodiment using $CHF_3/CF_4/O_2$ gas, even if the surfaces of source-drain electrode 14a and the drain terminal electrode 14b are exposed to plasma for about 300 seconds for example, the contact resistance is stable at a value having the same number of digits as when it is exposed to plasma for less than 300 seconds.

Further, according to this embodiment using $CHF_3/CF_4/O_2$ gas, the contact resistance remains stable at a value having the same number of digits even if the pressure is set within a range of 5 to 30 Pa.

Other Exemplary Embodiments

According to a second exemplary embodiment, a Cr film, an alloy film principally composed of Cr, an Al film, or an alloy film principally composed of Al is used as metal films which are located at different depth positions in an insulating layer and are not evaporated by dry etching using a fluorine containing gas.

According to a third exemplary embodiment, the gas flow rates of $CHF_3$ and $CF_4$ in the mixed gas consisting of $CHF_3$, $CF_4$ and $O_2$ satisfies the relation of $CHF_3 > CF_4$.

According to a fourth exemplary embodiment, the duration of time for which the metal films exposed through the contact hole are exposed to plasma during the dry etching process falls within a range of 60 to 300 seconds.

According to a fifth exemplary embodiment, the duration of time for which the oxygen ashing is performed falls within a range of 120 to 240 seconds.

According to a sixth exemplary embodiment, the method has a step of performing wet etching prior to the dry etching process.

According to a seventh exemplary embodiment, carbonaceous polymer deposit derived from the mixed gas of $CHF_3$, $CF_4$ and $O_2$ is formed in the dry etching process on the surface of the contact holes and on the surface of the metal films exposed through the contact holes.

According to an eighth exemplary embodiment, the contact holes and the metal films exposed through the contact holes are over-etched during the dry etching process.

The contact hole forming method according to the present invention uses a simple process, but yet is capable of reducing the contact resistance between the electrode formed of a Cr film or an Al film and the transparent conductive film formed in the contact holes.

It should be understood that the present invention is not limited to the embodiments described above, but various changes and modifications may be made within the purview of the appended claims.

For example, the present invention is also applicable to a method for forming three or more contact holes by a one-mask process so as to reach electrodes, wirings, or terminals which are present at three or more different depth positions.

In the present invention, PFC or HFC of such a high order that the primary component generated by plasma is $CF^{3+}$ may be used as the etching gas for use in the dry etching process.

Further, the insulating layer may be either an inorganic film such as SiN or an organic film such as acrylic resin.

Moreover, the present invention is not limited to the five-mask process as shown in FIGS. 4A to 4G, but is also applicable to a four-mask process for fabricating a TFT having an interlayer separation structure. It should be noted that regardless of whether the four-mask process or the five-mask process is used, the formation of the contact holes is carried out by using a one-mask process.

What is claimed is:

1. A method of producing an active matrix substrate in which a plurality of contact holes are formed by a one-mask process so as to reach metal films which are located at different depth positions in an insulating layer, comprising the steps of:

performing dry etching using mixed gas of $CHF_3$, $CF_4$ and $O_2$ to form the plurality of contact holes and to expose the metal films, depositing carbonaceous polymer from the $CF_4$ on surfaces of the contact holes and on surfaces of the metal films exposed through the contact holes, while the carbonaceous polymer is partially removed by the $O_2$ in the form of $CO_2$;

subjecting the plurality of contact holes to oxygen ashing to further remove the carbonaceous polymer; and forming a transparent conductive film in the plurality of contact holes, wherein the metal films are fluorinated and are not etched by dry etching using a fluorine-containing gas.

2. The method according to claim 1, wherein:
   the metal films are a Cr film, an alloy film primarily composed of Cr, an Al film, or an alloy film primarily composed of Al.

3. The method according to claim 1, wherein:
   the gas flow rates of $CHF_3$ and $CF_4$ in the mixed gas consisting of $CHF_3$, $CF_4$ and $O_2$ satisfy a relation of $CHF_3 > CF_4$.

4. The method according to claim 1, wherein:
   a duration of time for which the metal films exposed through the contact holes are exposed to plasma in the dry etching falls within a range of 60 to 300 seconds.

5. The method according to claim 1, wherein:
   a duration of time for which the oxygen ashing is performed falls within a range of 120 to 240 seconds.

6. The method according to claim 1, wherein:
   the contact holes and the metal films exposed through the contact holes are over-etched in the dry etching.

* * * * *

UNITED STATES PATENT AND TRADEMARK OFFICE
CERTIFICATE OF CORRECTION

PATENT NO. : 7,855,152 B2
APPLICATION NO. : 11/782929
DATED : December 21, 2010
INVENTOR(S) : Kiyoshi Yanase and Satoshi Doi It is certified that error appears in the above-identified patent and that said Letters Patent is hereby corrected as shown below:

Column 5, Line 14: delete "Therefore, the proportion between $CHF_3$ and $CF_4$ in the $CHF_3/CF_4/O_2$ gas is preferably set such that $CHF_3 > CF_4$." and insert the same on Col. 5, Line 13 after "used." as a continuation of the Paragraph.

Column 9, Line 15: delete "not evaporated" and insert -- not etched --.

Signed and Sealed this
Twenty-seventh Day of September, 2011

David J. Kappos
*Director of the United States Patent and Trademark Office*